(12) United States Patent
Chen

(10) Patent No.: US 6,812,555 B2
(45) Date of Patent: Nov. 2, 2004

(54) MEMORY CARD SUBSTRATE WITH ALTERNATING CONTACTS

(75) Inventor: Chien-Hung Chen, Taipei (TW)

(73) Assignee: Everstone Industry Corp., Taipei Hsien (TW)

( * ) Notice: Subject to any disclaimer, the term of this patent is extended or adjusted under 35 U.S.C. 154(b) by 0 days.

(21) Appl. No.: 10/385,174

(22) Filed: Mar. 10, 2003

(65) Prior Publication Data

US 2004/0178513 A1 Sep. 16, 2004

(51) Int. Cl.$^7$ .......................... G10O 15/06; G03G 13/00
(52) U.S. Cl. .................. 257/679; 257/668; 257/207; 257/211; 257/210; 257/775; 257/776; 439/59; 439/61; 360/760; 360/403; 360/704; 360/706; 360/407; 365/51; 365/52; 365/63; 365/54; 365/226; 365/228; 365/193
(58) Field of Search ...................... 257/679, 691, 257/668, 207, 211, 210, 203, 784, 786; 439/59, 61; 360/760, 403, 704, 706, 407; 365/51, 52, 63, 54, 226, 228, 193

(56) References Cited

U.S. PATENT DOCUMENTS

| | | | | |
|---|---|---|---|---|
| 4,287,525 A | * | 9/1981 | Tagawa | 347/148 |
| 4,580,193 A | * | 4/1986 | Edwards | 361/775 |
| 5,270,964 A | * | 12/1993 | Bechtolsheim et al. | 365/52 |
| 5,841,686 A | * | 11/1998 | Chu et al. | 365/51 |
| 5,856,937 A | * | 1/1999 | Chu et al. | 365/51 |
| 6,004,139 A | * | 12/1999 | Dramstad et al. | 439/59 |
| 6,025,992 A | * | 2/2000 | Dodge et al. | 361/704 |
| 6,537,850 B1 | * | 3/2003 | Corisis | 438/106 |

* cited by examiner

Primary Examiner—Alexander Oscar Williams
(74) Attorney, Agent, or Firm—William E. Pelton, Esq.

(57) ABSTRACT

A memory card substrate includes a first solder pad assembly formed on a top edge of the memory card substrate. The first solder pad assembly has multiple first solder pads equally spaced from each other and multiple first gaps each sandwiched between two adjacent first solder pads. A second solder pad assembly is formed on a bottom edge of the memory card substrate and has multiple second solder pads equally spaced from each other and multiple second gaps each sandwiched between two adjacent second solder pads. Each first solder pad corresponds to one of the second gaps so that the first solder pads are alternately arranged on the top edge relative to the second solder pads on the bottom edge.

3 Claims, 7 Drawing Sheets

MEMORY CARD SUBSTRATE WITH ALTERNATING CONTACTS

BACKGROUND OF THE INVENTION

1. Field of the Invention

The present invention relates to a memory card substrate, and more particularly to a memory card substrate with first contacts formed on a top face of the memory card substrate and second contacts alternately formed on a bottom face of the memory card substrate relative to the first contacts on the top face.

2. Description of Related Art

Because of the miniaturization now possible of electronic devices, vast capacity and a large variety of applications have become the main stream in modern design applications. However, no matter how powerful or how many different functions a designed electronic element may be or accomplish, a uniform specification should be required. Otherwise, compatibility and lack of it become a very important issue for users when using different electronic products.

Yet even though there is a uniform specification for electronic products with the same function, drawbacks still bother the designers. Taking the conventional edge connector for an example, the edge connector has contacts on opposite sides of a substrate of the edge connector. The contacts on one side of the edge connector correspond to but do not contact with the contacts on the other side of the edge connector. When the substrate is sufficiently thick, the operation of the contacts on one side of the substrate does not interfere with the operation of the contacts on the other side. However, when the substrate is thin, interference occurs between the contacts on opposite sides.

With reference to FIG. 6, a conventional memory card is shown. The memory card has a substrate (70) with contacts (71) on opposite edge of the substrate (70). The contacts (71) on either edge of the substrate (70) are equi-spatially separate from each other and each has a solder pad (710) securely formed on the substrate (70). The solder pads (710) are also arranged on opposite edges of the substrate (70), as shown in FIG. 7. When the memory card is in use and when the thickness of the substrate (70) is substantially thick, there is no interference between the solder pads (710) on opposite edges of the substrate (70). However, when the substrate thickness is designed thinner and thinner due to the modern trend of miniaturized electronic components, interference occurs between the solder pads (710) on opposite edges of the substrate (70).

To overcome the shortcomings, the present invention tends to provide an improved memory card substrate to mitigate and obviate the aforementioned problems.

SUMMARY OF THE INVENTION

The primary objective of the present invention is to provide an improved memory card substrate with alternate contacts such that interference is minimized.

Another objective of the present invention is to provide an improved memory card substrate that is smaller than 1.0 mm in thickness and has a first row of solder pads formed on an upper edge of the memory card substrate and a second row of solder pads formed on a lower edge of the memory card substrate. A phase difference exists between the first row of solder pads and the second row of solder pads.

Other objects, advantages and novel features of the invention will become more apparent from the following detailed description when taken in conjunction with the accompanying drawings.

DETAILED DESCRIPTION OF THE PREFERRED EMBODIMENT

Figure 1:
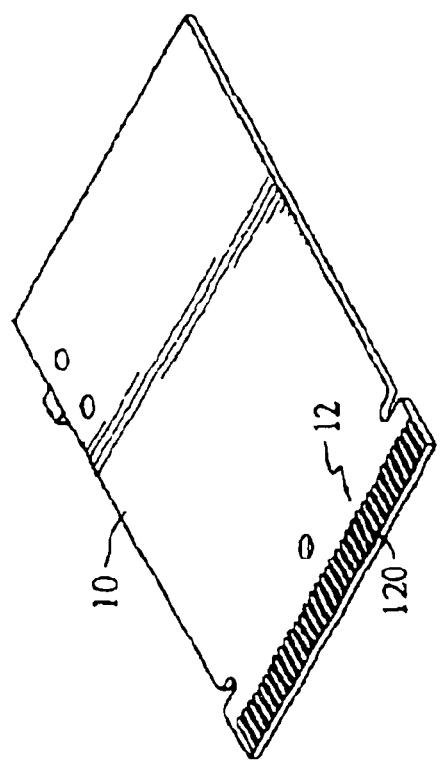
FIG. 1 is an exploded perspective view of the memory card of the present invention.
Figure 1:
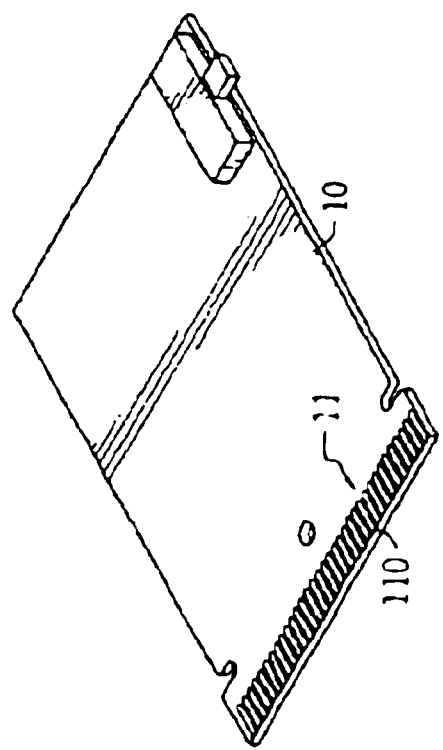

With reference to FIG. 1, a memory card with a substrate (10) is shown and has a first solder pad assembly (11) formed on a top edge of the substrate (10) and a second solder pad assembly (12) formed on a bottom edge of the substrate (10), wherein the top edge corresponds to the bottom edge.

The first solder pad assembly (11) has multiple first solder pads (110) formed on the top edge of the substrate (10). The second solder pad assembly (12) has multiple second solder pads (120) formed on the bottom edge of the substrate (10).

Figure 2:
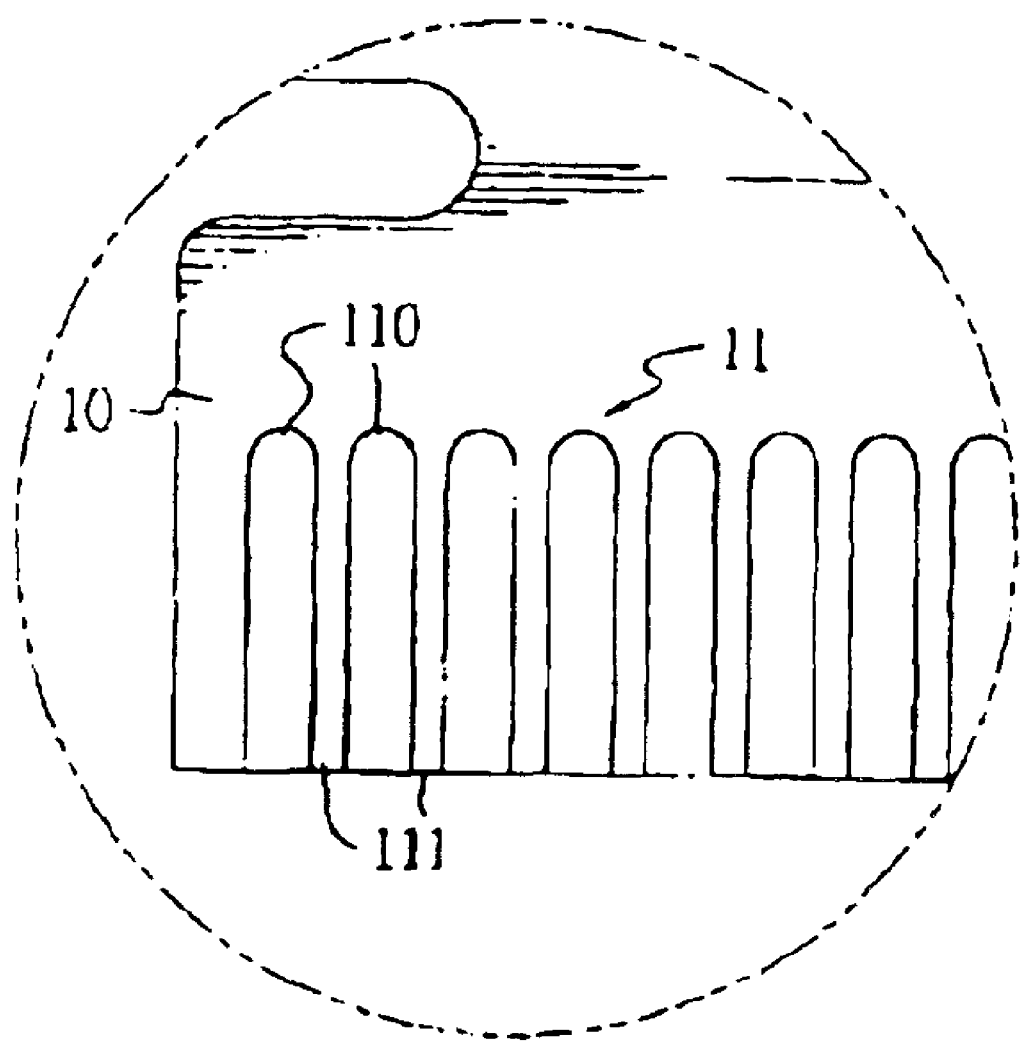
FIG. 2 is a schematic view of a portion of a substrate of the memory card to show that the substrate has a first solder pad assembly formed on a top face of the substrate.
Figure 3:
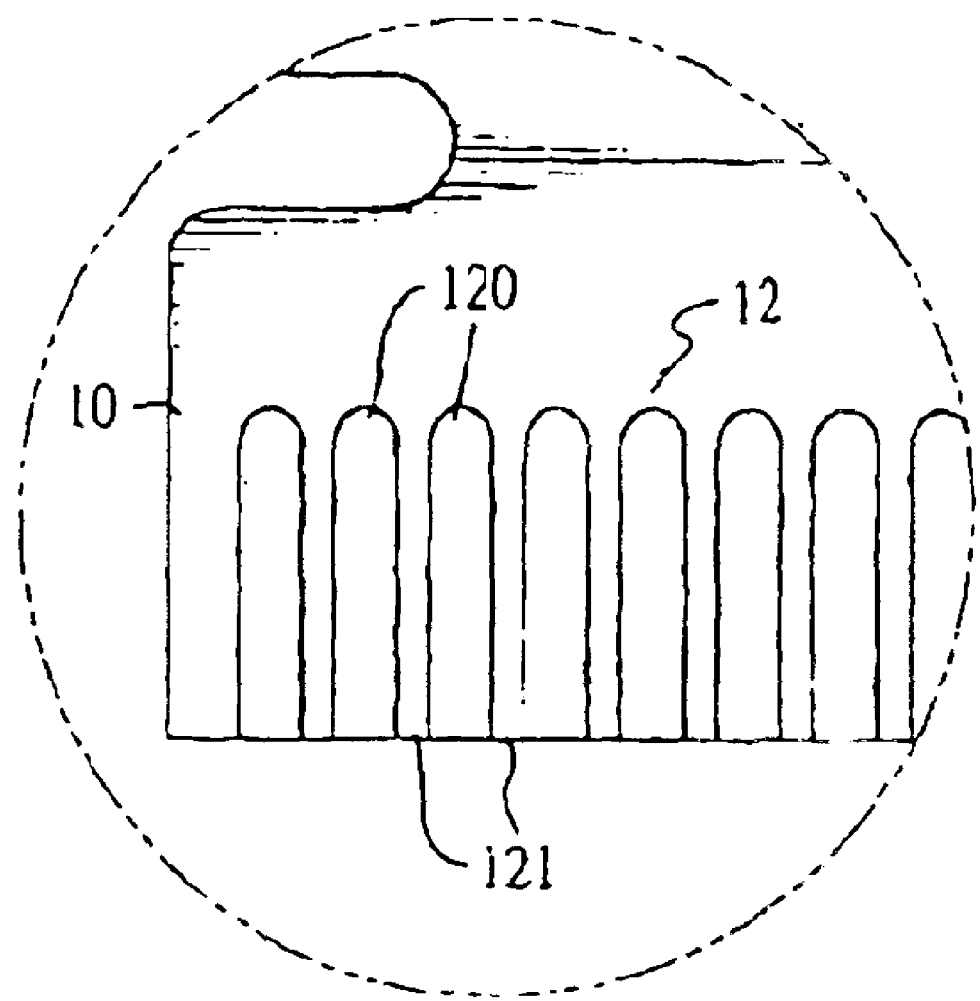
FIG. 3 is a schematic view of a portion of a substrate of the memory card to show that the substrate has a second solder pad assembly formed on a bottom face of the substrate.

With reference to FIGS. 2 and 3, each of the first solder pads (110) of the first solder pad assembly (11) is spaced from each other by a first gap (111) and each of the second solder pads (120) of the second solder pad assembly (12) is spaced from each other by a second gap (121).

Figure 4:
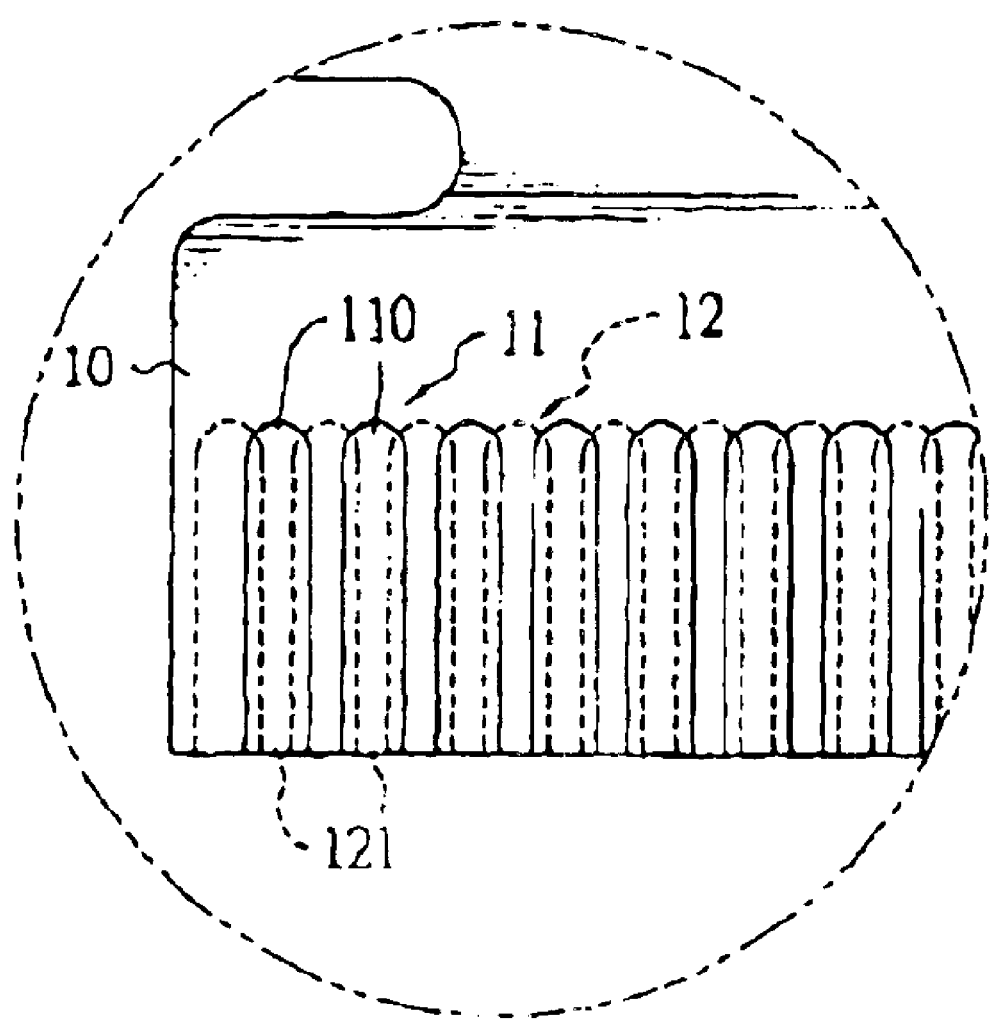
FIG. 4 is a schematic view showing that each first solder pad of the first solder pad assembly and each second solder pad of the second solder pad assembly are partially superposed with each other.

In order to avoid interference, a phase difference exists between the first solder pad assembly (11) and the second solder pad assembly (12). That is, as shown in FIG. 4, each of the first solder pads (110) corresponds to one of the second gaps (121).

Figure 5:
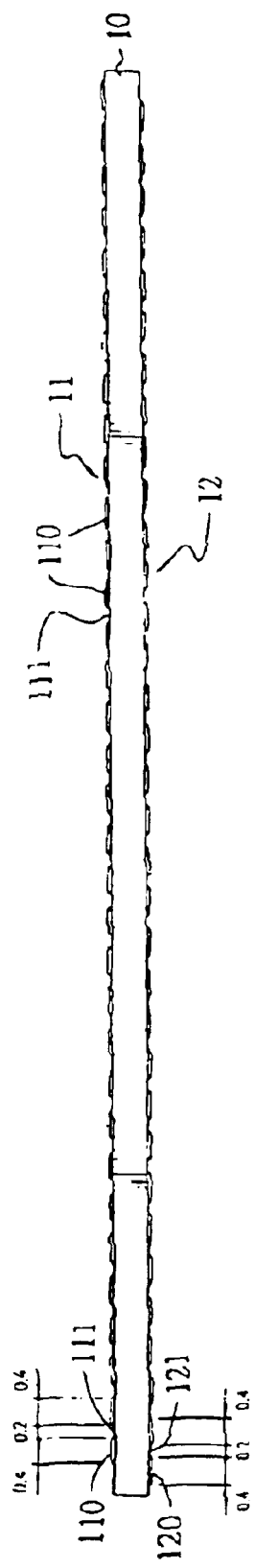
FIG. 5 is an end view of the substrate of the memory card showing the arrangement of the first solder pad assembly and the second solder pad assembly.
Figure 6:
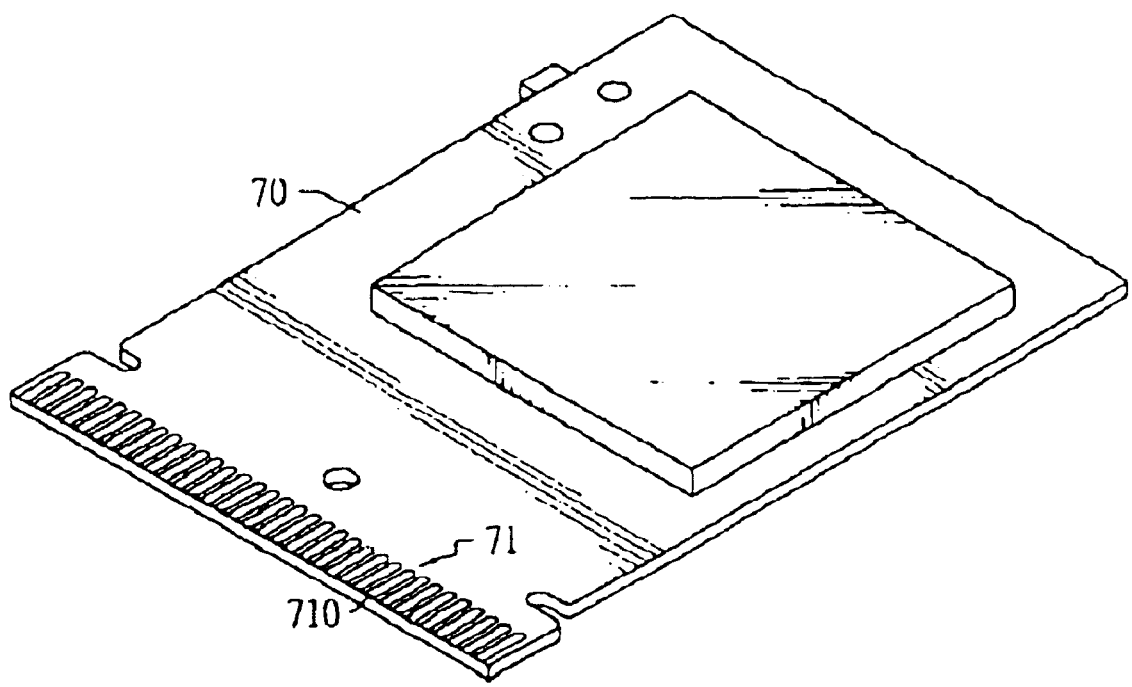
FIG. 6 is a perspective view of a conventional memory card.
Figure 7:
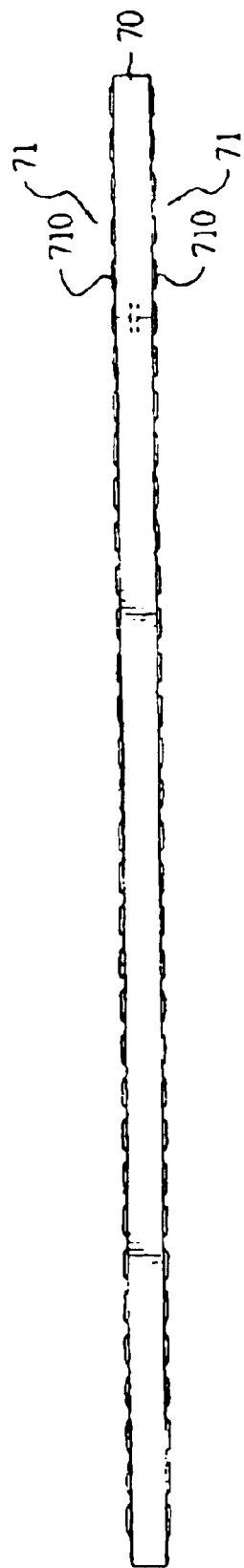
FIG. 7 is an end view of the conventional memory card.

With reference to FIG. 5, in order to have a better understanding of the arrangement of the first solder pads (110) and the second solder pads (120) formed on the top edge and the bottom edge of the substrate (10) respectively, it is supposed that each of the first solder pads (110) and each of the second solder pads (120) respectively have a width of 0.4 mm. Each of the first gaps (111) and each of the second gaps (121) have a width of 0.2 mm respectively. With the criteria set forth, each of the first solder pads (110) corresponds to one of the second gaps (121). Furthermore, due to the width of each of the first solder pads (110) and the second solder pads (120), opposite sides of each of the first solder pads (110) superpose with two adjacent second solder pads (120).

Therefore, it is concluded that an area that corresponds to one of the second gaps (121) of the first solder pad (110) is larger than an area of the first solder pad (110) that superposes with one of the second solder pads (120). That is, a major part of the area of each of the first solder pads (110) corresponds to a void and only a small quantity of the area of the first solder pads (110) superposes the second solder pad (120) such that interference is reduced to minimum.

Each first solder pad may correspond to one of the second gaps so that the first solder pads are alternately arranged on the top edge relative to the second solder pads on the bottom edge to avoid interference therebetween. That is, there is no superposition between the first solder pad assembly and the second solder pad assembly.

Furthermore, with the arrangement of the solder pad assembly, the wiring on the substrate is much easier. That is, when the solder pads on the substrate completely superposes, the possibility of superpose of wiring around the solder pads is high, which results in high interference to the signal transmission. In order to avoid interference, redesign of the wiring is necessary. However, with the alternate arrangement of the solder pads, the possibility of the superposing solder pads is greatly reduced and wiring on the substrate is easy.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory card substrate comprising:

a first solder pad assembly formed on a top edge of the memory card substrate and having multiple first solder pads spaced from each other and multiple first gaps each sandwiched between two adjacent first solder pads; and a second solder pad assembly formed on a bottom edge of the memory card substrate and having multiple second solder pads spaced from each other and multiple second gaps each sandwiched between two adjacent second solder pads, wherein each first solder pad corresponds to one of the second gaps so that the first solder pads are alternately arranged on the top edge relative to the second solder pads on the bottom edge to avoid interference therebetween, opposite portions of each of the first solder pads being superposed with corresponding portions of each of two adjacent ones of said second solder pads, such that a first area that corresponds to one of the second gaps is larger than a second area of one of said first solder pads that is superposed with one of said second solder pads, the memory card substrate having a thickness smaller than 1.0 mm.

2. A memory card substrate comprising:

a first solder pad assembly formed on a top edge of the memory card substrate and having multiple first solder pads spaced from each other and multiple first gaps each sandwiched between two adjacent first solder pads; and a second solder pad assembly formed on a bottom edge of the memory card substrate and having multiple second solder pads spaced from each other and multiple second gaps each sandwiched between two adjacent second solder pads, wherein the memory card substrate has a thickness smaller than 1.0 mm, opposite portions of each of the first solder pads superposed with two adjacent second solder pads, a first area that corresponds to one of the second gaps of the first solder pad is larger than a second area of the first solder pad that superposes with one of the second solder pads.

3. The memory card substrate as claimed in claim 2, wherein each first solder pad corresponds to one of the second gaps so that the first solder pads are alternately arranged on the top edge relative to the second solder pads on the bottom edge to avoid interference therebetween.

* * * * *